United States Patent
Breems et al.

(10) Patent No.: US 7,605,728 B2
(45) Date of Patent: Oct. 20, 2009

(54) METHOD FOR CALIBRATING A MULTI-BIT DIGITAL-TO-ANALOG CONVERTER, MULTI-BIT DIGITAL-TO-ANALOG CONVERTER IN WHICH THIS METHOD IS APPLIED AND CONVERTER PROVIDED WITH SUCH A MULTI-BIT DIGITAL-TO-ANALOG CONVERTER

(75) Inventors: Lucien Johannes Breems, Eindhoven (NL); Ovidiu Bajdechi, Delft (NL)

(73) Assignee: NXP B.V., Eindhoven (NL)

( * ) Notice: Subject to any disclaimer, the term of this patent is extended or adjusted under 35 U.S.C. 154(b) by 662 days.

(21) Appl. No.: 10/571,949

(22) PCT Filed: Sep. 13, 2004

(86) PCT No.: PCT/IB2004/051744

§ 371 (c)(1),
(2), (4) Date: Mar. 13, 2006

(87) PCT Pub. No.: WO2005/029163

PCT Pub. Date: Mar. 31, 2005

(65) Prior Publication Data

US 2007/0035423 A1    Feb. 15, 2007

(30) Foreign Application Priority Data

Sep. 15, 2003   (EP) ................... 03103383

(51) Int. Cl.
*H03M 1/10*    (2006.01)

(52) U.S. Cl. .............. 341/120; 341/115; 702/107
(58) Field of Classification Search ............ 341/120, 341/121, 126, 144, 155; 702/85, 107
See application file for complete search history.

(56) References Cited

U.S. PATENT DOCUMENTS

| | | | | |
|---|---|---|---|---|
| 5,646,619 A | * | 7/1997 | Daubert et al. | 341/118 |
| 5,955,980 A | * | 9/1999 | Hanna | 341/120 |
| 6,507,296 B1 | * | 1/2003 | Lee et al. | 341/120 |

OTHER PUBLICATIONS

Baird R T et al: "A Low Oversampling Ratio 14-B 500-KHZ Deltasigma . . . "; IEEE Journal of Solid-State Circuits; IEEE Inc. New York, US; vol. 31, No. 3; Mar. 1, 1996; pp. 312-320.

* cited by examiner

Primary Examiner—Chi H Pham
Assistant Examiner—Weibin Huang

(57) ABSTRACT

In a method for calibrating a multi-bit DAC intended, particularly, for application in high-speed and high-resolution ADCs, such as Σ Δ ADCs, and comprising a number of DAC cells, apart from the number of DAC cells applied in the multi-bit DAC for conversion, an additional DAC cell is provided, which can be interchanged with each of the other DAC cells in order to switch each DAC cell successively from the multi-bit DAC into a calibration circuit to calibrate said DAC cell without interrupting the conversion. The calibration circuit includes means for measuring errors in the DAC cell under calibration and means for correcting said DAC cell.

6 Claims, 3 Drawing Sheets

Figure 1:
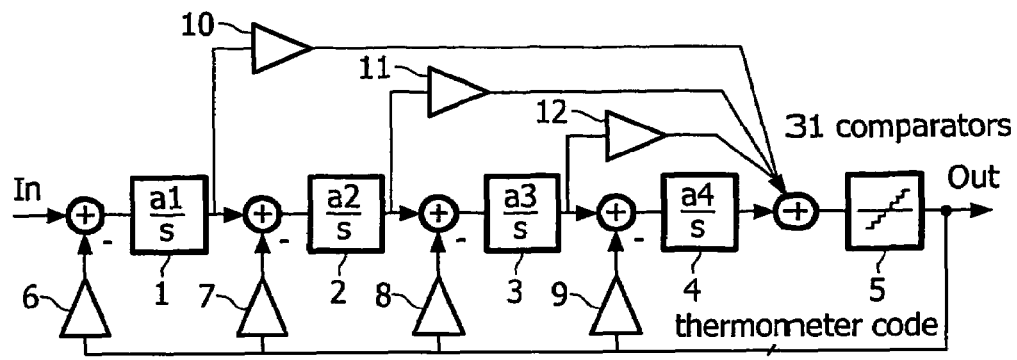

METHOD FOR CALIBRATING A MULTI-BIT DIGITAL-TO-ANALOG CONVERTER, MULTI-BIT DIGITAL-TO-ANALOG CONVERTER IN WHICH THIS METHOD IS APPLIED AND CONVERTER PROVIDED WITH SUCH A MULTI-BIT DIGITAL-TO-ANALOG CONVERTER

The invention relates to a method for calibrating a multi-bit digital-to-analog converter (DAC) intended, particularly, for application in high-speed and high-resolution analog-to-digital converters (ADCs), such as $\Sigma \Delta$ ADCs, and comprising a number of digital-to-analog converter cells (DAC cells).

In known methods switching means, present in the DAC cells for normal conversion operation, are inactive during calibration. When the multi-bit digital-to-analog converter is applied in a $\Sigma \Delta$ ADC, any charge injected by these switching means in the integrators of the $\Sigma \Delta$ ADC during normal operation is not accounted for by the known calibration method.

The purpose of the invention is to avoid this problem and to provide a multi-bit DAC in which the calibration is performed more accurately.

Therefore, according to the invention, the method as described in the opening paragraph is characterized in that, apart from the number of DAC cells applied in the multi-bit DAC for conversion, an additional DAC cell is provided, which can be interchanged with each of the other DAC cells in order to switch each DAC cell successively from the multi-bit DAC into a calibration circuit to calibrate said DAC cell without interrupting the conversion. This method is indicated as 'an active calibration method', contrary to the known methods which can be considered as passive calibration methods.

The invention further relates to a multi-bit digital-to-analog converter (DAC), particularly for application in high-speed and high-resolution analog-to-digital converters (ADCs), such as $\Sigma \Delta$ ADCs, comprising a number of digital-to-analog converter cells (DAC cells) and a calibration circuit to calibrate these DAC cells. According to the invention the multi-bit digital-to-analog converter is characterized in that, apart from the number of DAC cells applied in the multi-bit DAC for conversion, an additional DAC cell is provided, which can be interchanged with each of the other DAC cells, and switching means to switch each DAC cell successively from the multi-bit DAC into the calibration circuit to calibrate said DAC cell without interrupting the conversion.

Although binary-coded DACs could be calibrated in the same way as described above, in a preferred embodiment and from the point of view of simplification, each DAC is formed by unitary DAC cells. In a particular embodiment the calibration circuit with a unitary DAC cell included therein forms a 1-bit analog-to-digital converter. So, the latter DAC cell can be used in the same manner as in an ADC, wherein the multi-bit DAC is applied. By virtue of this measure not only the DC mismatch of a DAC cell, but also its dynamic mismatch as a consequence of switching parasitic effects can be measured and compensated.

The invention also relates to a converter provided with a multi-bit digital-to-analog converter as indicated above. More specifically, the calibration process indicated above is suitable for application in high-speed high-resolution ($\Sigma \Delta$) DACs, $\Sigma \Delta$ ADCs, pipeline ADCs and successive approximation ADCs.

Figure 2:
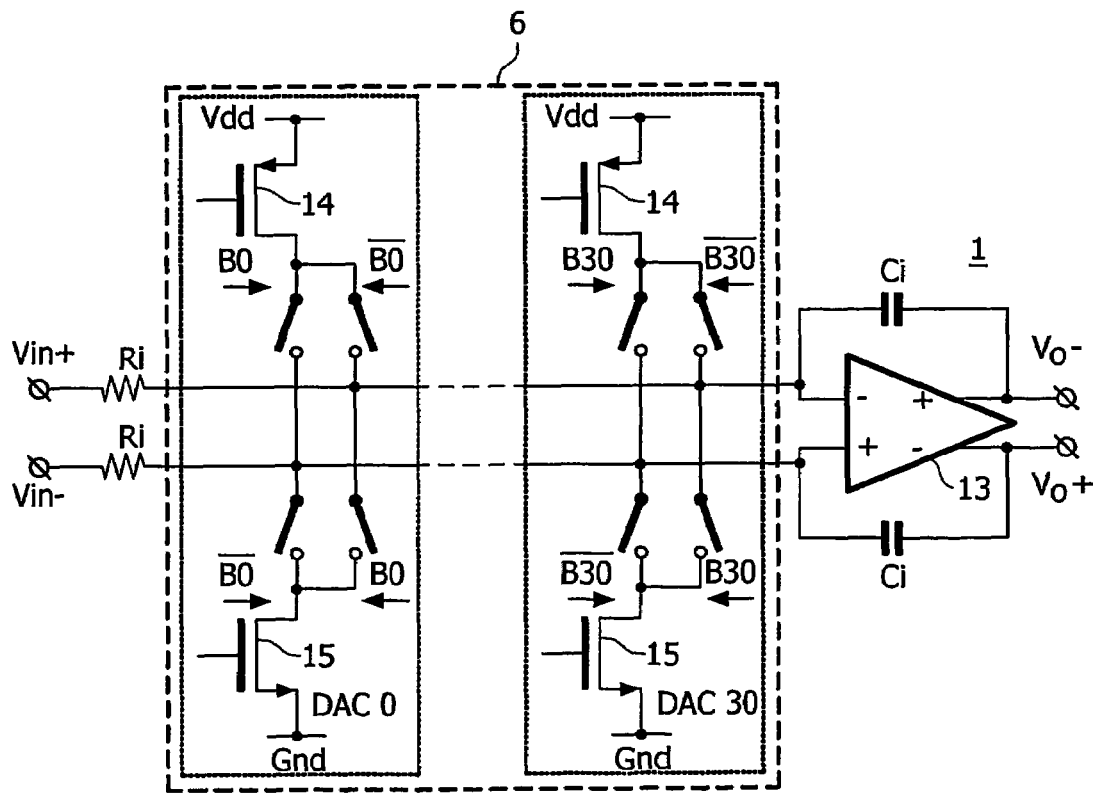
Figure 3:
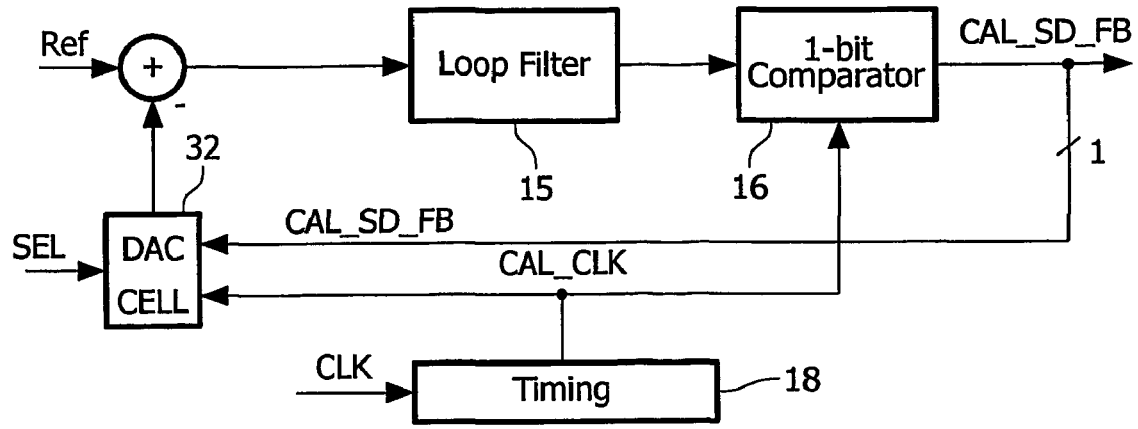
Figure 4:
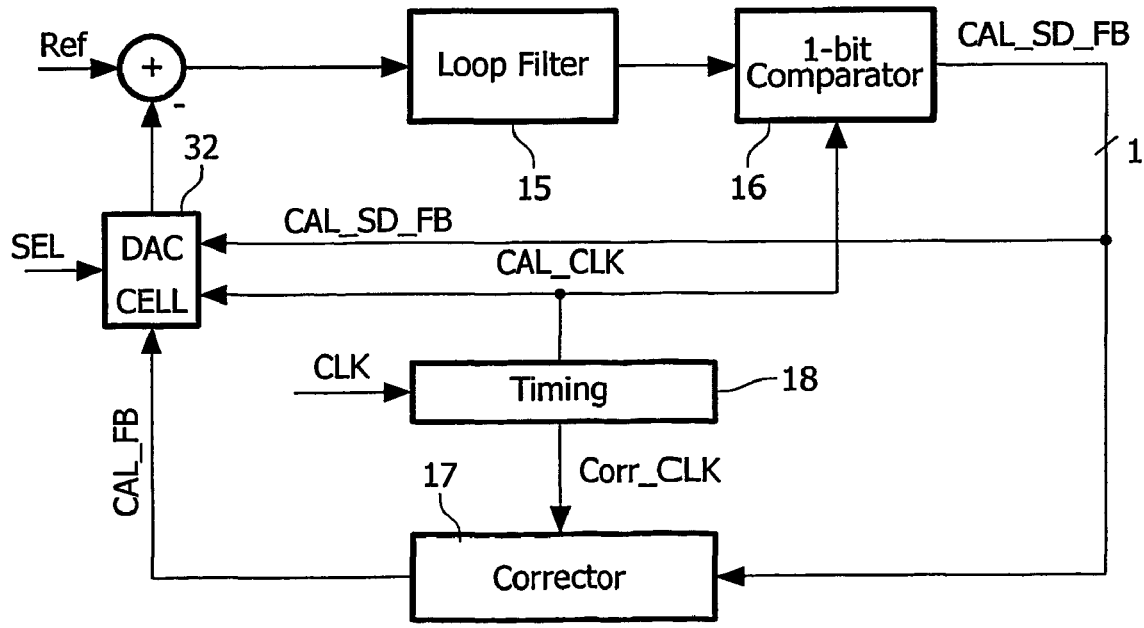
Figure 5:
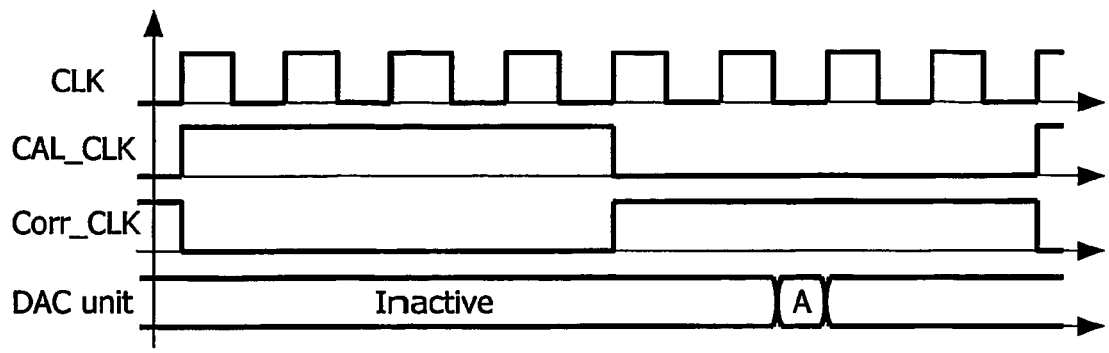
Figure 6:
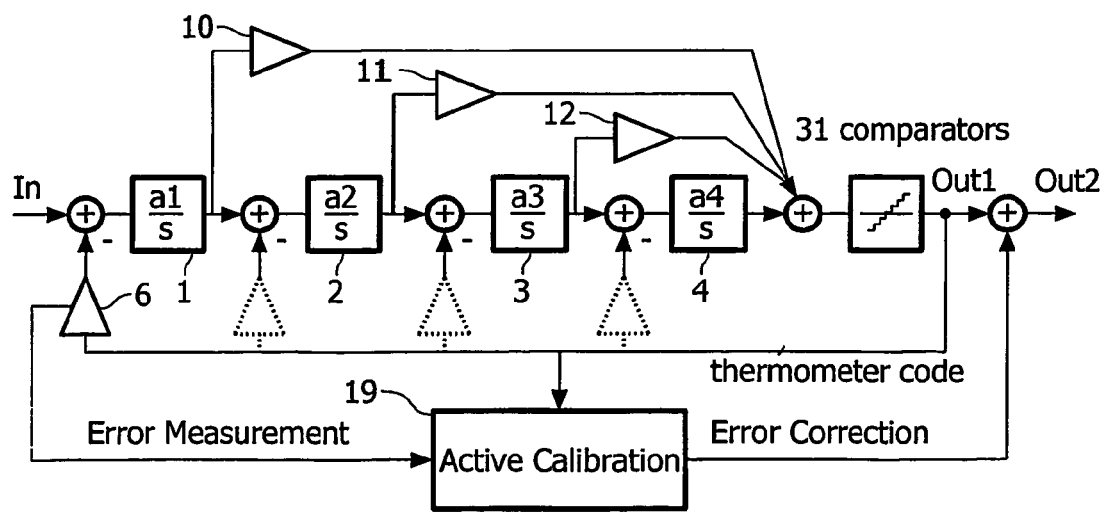

The above and other objects and features of the present invention will become more apparent from the following detailed description considered in connection with the accompanying drawings, in which:

FIG. 1 shows a loop topology for a $\Sigma \Delta$ ADC;
FIG. 2 shows a 5-bit DAC with integrator, being part of the $\Sigma \Delta$ ADC;
FIG. 3 shows a DAC cell mismatch measuring circuit;
FIG. 4 shows a first embodiment of a calibration circuit according to the invention;
FIG. 5 shows a time diagram illustrating the operation of the embodiment of FIG. 4;
FIG. 6 shows a second embodiment of a calibration circuit according to the invention.

FIG. 1 shows an example of a multi-bit $\Sigma \Delta$ ADC topology with four integrators 1-4, a 5-bit quantizer 5 comprising 31 comparators, 5-bit DACs 6-9 in a feedback configuration and controlled by a thermometer-coded signal supplied by the quantizer 5, and, in a feed-forward configuration, STF (signal transfer function) control elements 10-12. The main design challenge usually lies in the first integrator 1 which has to perform at full specifications, the performance requirements for the following integrators being relaxed by the loop gain.

For the first integrator 1 an active-RC topology is used. This topology, illustrated in FIG. 2, shows high linearity by connecting both the DAC 6 and the input resistors Ri to the virtual ground nodes at the input of an operational amplifier 13 of the integrator 1. The DAC 6 comprises a set of 31 DAC cells, DAC0, DAC1, . . . , DAC31, each being implemented as a pseudo-differential current source controlled by a thermometer-coded 31-bit word (B0, B1, . . . , B30) supplied by the quantizer 5. Each DAC cell i (i=0, 1, . . . , 30) for this purpose comprises transistors 14, 15 and switches, controlled by signals Bi and Bi-inverted. When Bi=1 a current flows to the +input of the operational amplifier 13, and when Bi=0 there is a current flow to the −input of the operational amplifier 13. Each of the 31 DAC cells is switched directly or cross-coupled to the operational amplifier 13 according to the decision of the corresponding comparator in the quantizer 5.

Contrary to a single-bit $\Sigma \Delta$ ADC, a multi-bit design suffers from non-linear distortion induced by non-linear DAC behavior. Multi-bit DACs have multiple states and their differential non-linearity is defined by the peak difference between any of these states and the line interpolated on the entire state set. Hence, process-induced mismatch of DAC cells in a multi-bit DAC reduces its linearity. As an example, in a $\Sigma\Delta$ADC designed for 100 dB DR (dynamic range), mismatch values of 5% may reduce the DR below 60 dB by means of harmonic distortion and modulation of out-of-band noise at lower frequencies. A mismatch lower than 0.01% will not produce any significant increase in DR and SN-DR values, because the power of harmonics induced by non-linearity decreases to a level below the in-band noise power. Such good matching (0.01%) cannot be attained only with good layout techniques or large transistor gate area The separate DAC cells have to be calibrated to attain this matching level.

In the present invention the calibration procedure is a background calibration, with 32 DAC cells actually implemented in total; only 31 of them are used at any given time in the $\Sigma \Delta$ ADC as described above and indicated in the following as 'main $\Sigma \Delta$ ADC'. Meanwhile, the spare DAC cell is calibrated. Each of the DAC cells is alternately chosen as spare DAC cell and calibrated. So, each DAC unit is calibrated once per calibration cycle. For each DAC cell, the calibration is performed by placing it in a 'calibration $\Sigma \Delta$ ADC', which is a single-bit design. The DAC unit under calibration is used as a one-bit DAC in the calibration $\Sigma \Delta$ ADC. The digital output of the calibration $\Sigma \Delta$ ADC is a digital expression of the output current of each DAC cell.

This active calibration principle according to the invention has been developed to address both the mismatch of DC currents between different DAC cells and the mismatch between their associated switches, which can change the amount of charge supplied by clock feed-through and charge injection in the integrator. In all classical (passive) calibration methods, the switches actually used in normal DAC operation are inactive during calibration. Hence, any charge injected in the integrator by these switches during normal operation is not accounted for by the calibration procedure.

As mentioned above and shown in FIG. 3, the active calibration is based on using a single-bit $\Sigma\Delta$ ADC to compare a fixed input signal Ref with the current of the DAC cell under calibration. This cell is chosen from the 32 available cells by a selection signal SEL, while the other 31 cells are used in the main $\Sigma\Delta$ ADC. The calibration $\Sigma\Delta$ ADC is built with a loop filter 15 which insures the shaping of the quantization noise introduced by the 1-bit comparator 16 supplying the 1-bit CAL SD FB feedback signal used to switch a DAC cell 32 as part of the calibration $\Sigma\Delta$ ADC. The DC component of the digital stream CAL SD FB represents the ratio between the Ref signal and the current of the DAC cell 32.

The entire calibration circuit can be operated at a lower speed than the main $\Sigma\Delta$ ADC by deriving a clock signal CAL CLK from the master clock CLK of the main $\Sigma\alpha$ ADC. Reducing the CAL CLK frequency can help reduce power consumption of the calibration circuit but it also increases calibration slot time.

By placing the DAC cells of a multi-bit $\Sigma\Delta$ ADC in a 1-bit calibration $\Sigma\Delta$ ADC, not only their DC mismatch but also their dynamic mismatch (switching effects) can be measured and compensated. This principle of active calibration can be used to modify the output of each DAC cell to match the target value Ref. Apart from the calibration $\Sigma\Delta$ loop of FIG. 3, by means of which the mismatch is measured, another loop is closed by a corrector block 17 (see FIG. 4) to actuate the value of the DAC cell under calibration.

The corrector 17 reads the 1-bit CAL SD FB signal, which is a digital expression of the ratio of the DAC cell current and the reference input signal Ref. This value is processed in digital domain and compared with a reference state generated inside the corrector, based on the timing signals Corr CLK. The difference between the calibration $\Sigma\Delta$ ADC output and the reference state signal in the corrector 17 is used to correct the DAC cell under calibration using the CAL FB signals.

Hence, the active calibration loop corrects the DAC cell on each CAL CLK clock cycle, during an entire calibration slot. The calibration error, i.e. the correction signal as generated by the corrector 17, decreases during the calibration slot, the slot ending when the calibration error decreases below a target value.

When the slot ends, major disturbances in the DAC cell output may be created by disconnecting the DAC cell from the calibration loop closed by the corrector 17. To prevent this, the calibration timing during one calibration slot can be designed so that the DAC cell is only used to provide feedback to the calibration $\Sigma\Delta$ ADC when it is disconnected from the corrector 17. In FIG. 5, in the timing unit 18, the main CLK signal, which is used to drive the main $\Sigma\Delta$ ADC, is divided by 8 to get the calibration clock CAL CLK. The corrector 17 only actuates the DAC cell when the correction clock signal Corr CLK is logic-low, which corresponds with the calibration clock CAL CLK; during this time the DAC cell is not used to supply feedback to the calibration $\Sigma\Delta$ ADC. The DAC cell is active only for a short time A (FIG. 5), after the calibration has been inhibited by rising Corr CLK. By so timing the calibration signals, any effect of the ON- or OFF-switching of the calibration loop closed by the corrector 17 is placed under calibration. Disconnecting the DAC cell from the calibration loop at the end of the calibration slot will leave the DAC cell calibrated to exactly match the Ref value.

At the same time, by so timing the calibration process, the DAC cell is used in the calibration $\Sigma\Delta$ ADC for a period of time identical to the time that it is used in the main $\Sigma\Delta$ ADC. This means that the relative effect of switching-induced charge compared with the DC output is identical during normal use and calibration, so this effect is better compensated by the calibration process.

As mentioned before, one advantage of this active calibration method consists of the dynamic use of the DAC cell under calibration by placing it in a one-bit $\Sigma\Delta$ ADC with DC input. In this way, the DAC is used just like it is used under normal operation in the main $\Sigma\Delta$ ADC. Since for fast-switching DACs a significant part of their generated current comes from charge injection and clock feed-through at switching times, the importance of calibrating for these effects becomes obvious especially in new, high-speed CMOS processes where associated capacitances are increasing steadily. The only un-calibrated switching is to and from the calibration $\Sigma\Delta$ ADC, which is much slower than the normal operation speed; therefore it has negligible effects.

Another advantage of active calibration is its flexibility. Not only unitary DAC cells as described in the above, but also binary-coded DACs, which are combinations of non-identical DAC cells with a power-of-two ratio between them, can be calibrated using the same structure, only by shifting the digital state signal generated in the corrector 17 according to the ratio of the Ref signal and the order of the DAC cell in the binary-coded DAC. If the LSB DAC does not overload the calibration $\Sigma\Delta$ ADC and the dynamic range of the calibration $\Sigma\Delta$ ADC is large enough to accurately convert Ref with the MSB DAC as the calibration feedback DAC, there is no need to change any analog signal to calibrate the entire binary-coded DAC. The only change is digital and therefore in a perfect 1:2 ratio. The active calibration can also be adapted to a large range of calibration precisions by trading slot duration for accuracy even without changing the power consumption.

The output of the calibration $\Sigma\Delta$ ADC can be used in different ways to correct the distortion introduced in the main $\Sigma\Delta$ ADC by a non-linear DAC. In FIG. 6, assuming only the first DAC is present (or important from the point of view of non-linearity), its components (DAC cells) are measured one at a time by the active calibration circuit (the calibration 1-bit $\Sigma\Delta$ ADC) described with reference to FIG. 3. This active calibration circuit is incorporated in the active calibration block 19 of FIG. 6. The measured values of the ratios of the Ref signal and the output signals of the successive DAC cells (of DAC 6) under calibration, i.e. the error signals, are stored in a digital memory, being part of the active calibration block 19. In normal operation, the active calibration block 19 is fed with the main $\Sigma\Delta$ ADC output Out1 (which contains the distorted input signal spectrum). The active calibration block 19 generates, based on the set of DAC cells used to obtain the output Out1 and the stored results of the error measurements for these DAC cells, an error correction value which is added to the Out1 signal in digital domain to compensate for the non-linearity introduced by the DAC.

Resuming, it may be stated that a new calibration method for multi-bit digital-to-analog converters, particularly for CMOS current-mode, multi-bit digital-to-analog converters is described. As opposed to previously published calibrations which measure each DAC cell under calibration in a static manner, this active calibration places the DAC cell under calibration in the feedback loop of a calibration $\Sigma\Delta$ ADC, actually using the DAC cell in the same manner as it is used in the main Σ Δ ADC. This dynamic calibration not only calibrates for the DC current value of the DAC cell under calibration, but also calibrates for dynamic effects associated with the switching of the DAC cell. Furthermore, unwanted effects of different switches involved in calibrating the DAC cell can be reduced by correct timing during the calibration process.

The embodiment of the present invention described herein is intended to be construed in an illustrative and not limiting sense. Various modifications may be made to these embodiments by persons skilled in the art without departing from the scope of the present invention as defined in the appended claims.

For instance, it will be clear that although the embodiment of a multi-bit digital-to-analog converter according to the invention shown in FIG. 1, which is discussed in the accompanying part of the description, relates to a 5 bit digital-to-analog converter, the invention is not restricted to 5 bit digital-to-analog converters, but can be applied advantageously in digital-to-analog converters having a different resolution.

The invention claimed is:

1. Multi-bit digital-to-analog converter, for application in high-speed and high-resolution analog-to-digital converters, comprising a number of digital-to-analog converter cells (DAC cells) and a calibration circuit to calibrate these DAC cells, characterized in that, apart from the number of DAC cells applied in the multi-bit DAC for conversion, an additional DAC cell is provided, which can be interchanged with each of the other DAC cells, and switching means to switch each DAC cell successively from the multi-bit DAC into the calibration circuit to calibrate said DAC cell without interrupting the conversion; characterized in that the calibration circuit with a DAC cell incorporated therein comprises a 1-bit analog-to-digital converter supplying a feedback signal for controlling switches in the DAC cell, a combination circuit for combining the output signal of the DAC cell with a reference value, whereafter the combined signal is fed to the 1-bit analog-to-digital converter via a loop filter.

2. Multi-bit digital-to-analog converter according to claim 1, characterized in that each DAC cell is a unitary DAC cell.

3. Multi-bit digital-to-analog converter according to claim 1, characterized in that the calibration circuit with a DAC cell incorporated therein further comprises a corrector for calibration of the DAC cell in response to the output signal of the 1-bit comparator.

4. Multi-bit digital-to-analog converter according to claim 3, characterized in that a timing circuit is provided to generate a calibration slot time within a time interval wherein the 1-bit analog-to-digital converter is inactive with respect to DAC cell error measurement.

5. Multi-bit digital-to-analog converter according to claim 1, characterized in that an active calibration block is provided which together with a respective DAC cell includes the 1-bit analog-to-digital converter and further comprises a memory for storing the errors in the respective DAC cells, measured by the 1-bit analog-to-digital converter, while, based on these data and on the output signals of the converter in which the multi-bit digital-to-analog converter is applied, error correction values are generated and added to the output signal of the converter in which the multi-bit digital-to-analog converter is applied.

6. Converter provided with a multi-bit digital-to-analog converter as claimed in claim 1.

* * * * *